US009378801B2

(12) United States Patent
Oh

(10) Patent No.: US 9,378,801 B2
(45) Date of Patent: Jun. 28, 2016

(54) SEMICONDUCTOR MEMORY DEVICE

(71) Applicant: SK hynix Inc., Gyeonggi-do (KR)

(72) Inventor: Sang-Mook Oh, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 156 days.

(21) Appl. No.: 14/255,606

(22) Filed: Apr. 17, 2014

(65) Prior Publication Data

US 2015/0124538 A1    May 7, 2015

(30) Foreign Application Priority Data

Nov. 7, 2013    (KR) .......................... 10-2013-0134549

(51) Int. Cl.
*G11C 11/406* (2006.01)
(52) U.S. Cl.
CPC ................................ *G11C 11/40618* (2013.01)
(58) Field of Classification Search
CPC .................................................... G11C 11/406
USPC ........................................................ 365/222
See application file for complete search history.

(56) References Cited

U.S. PATENT DOCUMENTS

| 5,796,669 A * | 8/1998 | Araki ................... | G11C 7/1063 365/222 |
| 2005/0157577 A1* | 7/2005 | Barth ................... | G11C 11/406 365/230.03 |
| 2005/0265103 A1* | 12/2005 | Remaklus ........ | G11C 11/40611 365/222 |
| 2006/0268643 A1* | 11/2006 | Schreck ............... | G11C 11/406 365/222 |
| 2008/0049532 A1* | 2/2008 | Kajigaya .................. | G11C 8/12 365/222 |
| 2013/0028034 A1* | 1/2013 | Fujisawa .......... | G11C 11/40615 365/194 |
| 2013/0329482 A1* | 12/2013 | Gillingham ......... | G06F 13/1689 365/63 |
| 2013/0336079 A1* | 12/2013 | Kim ..................... | G11C 11/402 365/222 |

FOREIGN PATENT DOCUMENTS

KR    1020110131634    12/2011

* cited by examiner

*Primary Examiner* — Min Huang
(74) *Attorney, Agent, or Firm* — IP & T Group LLP

(57) ABSTRACT

A semiconductor memory device includes a plurality of banks; a plurality of word lines; an advanced refresh operation mode where two or more word lines are selected in parallel in each bank; a pulse generation unit suitable for generating a single bank refresh pulse that toggles for a given time in response to a single bank refresh command of a single bank refresh operation mode; and an address generation unit suitable for generating an advanced single bank address for selecting at least two word lines in one of the banks in response to the single bank refresh pulse and an input address in an entry section of the advanced refresh operation mode.

15 Claims, 3 Drawing Sheets

SEMICONDUCTOR MEMORY DEVICE

CROSS-REFERENCE TO RELATED APPLICATIONS

The present application claims priority of Korean Patent Application No. 10-2013-0134549, filed on Nov. 7, 2013, which is incorporated herein by reference in its entirety.

BACKGROUND

1. Field

Exemplary embodiments of the present invention relate to a semiconductor design technology, and more particularly, to a semiconductor memory device capable of supporting both a Single Bank Refresh (SBREF) operation scheme and an Advanced Refresh (AR) operation scheme.

2. Description of the Related Art

A single bank refresh (SBREF) operation scheme is an operation scheme where a refresh operation may be performed independently in each bank of a semiconductor memory device having a plurality of banks. In other words, the semiconductor memory device supporting the single bank refresh (SBREF) operation scheme may enable the plurality of banks to receive different commands and operate at an interval of Ras to Ras delay tRRD. For example, in a semiconductor memory device having a first bank and a second bank, although the first bank is in the middle of performing a refresh operation in response to a refresh command, the second bank may perform a normal data input/output operation in response to a normal read/write command after the interval of the delay tRRD passes. Similarly, although the first bank is in the middle of performing a normal data input/output operation in response to a normal read/write command, the second bank may perform a refresh operation in response to a refresh command after the interval of the delay tRRD passes. While all the multiple banks perform a refresh operation at the interval of the delay tRRD, all the banks are not to perform a normal read/write operation.

Since each of the multiple banks independently performs a refresh operation in the single bank refresh (SBREF) operation scheme, the refresh cycle tRFC at which a refresh operation is performed in each bank becomes an active pre-charge time tRP which should be ensured at least. In other words, the length of time ensured for each refresh operation is shortened due to the single bank refresh (SBREF) operation.

For this reason, the semiconductor memory device that supports the single bank refresh (SBREF) operation scheme may not perform a series-type advanced refresh (AR) operation where a plurality of word lines are enabled at an interval of time within the refresh cycle tRFC of the refresh operation performed in each bank. Instead, it performs a parallel-type advanced refresh (AR) operation in which the multiple word lines are simultaneously enabled within the refresh cycle tRFC. Here, the advanced refresh (AR) operation means an operation where multiple word lines are enabled during one refresh cycle.

When the absolute time of the Ras to Ras delay tRRD (which is a standard for a minimum operation time interval between the banks) is compared with the absolute time of the active pre-charge time tRP (which is a standard minimum time ensured for the refresh cycle tRFC) of each bank in the semiconductor memory device supporting the single bank refresh (SBREF) operation scheme, the Ras to Ras delay tRRD is generally smaller than the active pre-charge time tRP. Accordingly, when the parallel-type advanced refresh (AR) operation is performed in the semiconductor memory device supporting the single bank refresh (SBREF) operation scheme, the following concerns arise.

FIG. 1 is a timing diagram illustrating the concerns that arise when a parallel-type advanced refresh (AR) operation is performed in a the semiconductor memory device supporting the single bank refresh (SBREF) operation scheme in accordance with a prior art.

Referring to FIG. 1, when there are two banks and the parallel advanced refresh (AR) operation is performed in the semiconductor memory device supporting a single bank refresh (SBREF) operation scheme, it is an example of where a single bank refresh command BK<0> SBREF is applied to a first bank BK<0> and a refresh operation is performed, and then an active command BK<1> ACT is applied to a second bank BK<1> at an interval of Ras to Ras delay tRRD and a normal active operation is performed.

To be specific, the single bank refresh command BK<0> SBREF is applied to the first bank BK<0> and the refresh operation is performed in a section where an advanced enable signal AR_REF EN is enabled. The single bank refresh command BK<0> SBREF may be maintained during an interval of a refresh cycle tRFC. Also, while the refresh operation is performed in the first bank BK<0> during the advanced refresh (AR) operation, the internal addresses BAX12<0> and BAX12<1> are all enabled in response to the disabling of an input address ADD<12>.

One of characteristics of an address decoding method for the advanced refresh (AR) operation is that the internal addresses BAX12<0> and BAX12<1> have two values even though the input address ADD<12> has one value. When the refresh operation is performed in the section where the advanced enable signal AR_REF EN is enabled, two values of the internal addresses BAX12<0> and BAX12<1> are controlled in response to one input address ADD<12> in order to simultaneously enable two word lines in one bank. For example, in the section where the advanced enable signal AR_REF EN is enabled, the internal addresses BAX12<0> and BAX12<1> are disabled to a logic 'low' level when the input address ADD<12> is enabled to a logic 'high' level, and the internal addresses BAX12<0> and BAX12<1> are enabled to a logic 'high' level when the input address ADD<12> is disabled to a logic 'low' level. To simplify the description, just one input address ADD<12> among many input addresses (not shown) is illustrated in the drawing. During actual operation of the semiconductor memory device, the multiple word lines included in one bank are selected in pairs corresponding to each of all input addresses (not shown).

As described above, when the refresh operation is performed in the first bank BK<0>, the internal addresses BAX12<0> and BAX12<1> are simultaneously enabled and the advanced refresh (AR) operation is performed. Then, two word lines included in the first bank BK<0> among the multiple word lines are simultaneously enabled. The enabled internal addresses BAX12<0> and BAX12<1> are kept in the enabling state during the interval of the refresh cycle tRFC where the single bank refresh command BK<0> SBREF is enabled.

After the single bank refresh command BK<0> SBREF is applied to the first bank BK<0>, the active command BK<1> ACT is applied to the second bank BK<1> at the interval of the Ras to Ras delay tRRD and the normal active operation is performed. The active command BK<1> ACT is maintained during an active pre-charge time tRP.

When the active command BK<1> ACT is inputted, the advanced refresh (AR) operation may not be performed. Thus, one word line is to be enabled in one bank. Whether or not the two internal addresses BAX12<0> and BAX12<1> are enabled is determined in response to whether or not the input address ADD<12> is enabled. For example, when the input address ADD<12> is enabled to a logic 'high' level while the active command BK<1> ACT is enabled, the first internal address BAX12<0> between the two internal addresses BAX12<0> and BAX12<1> is disabled to a logic 'low' level and the second internal address BAX12<1> between the two internal addresses BAX12<0> and BAX12<1> is enabled to a logic 'high' level. On the contrary, when the input address ADD<12> is disabled to a logic 'low' level while the active command BK<1> ACT is enabled, the first internal address BAX12<0> between the internal addresses BAX12<0> and BAX12<1> is enabled to a logic 'high' level and the second internal address BAX12<1> between the internal addresses BAX12<0> and BAX12<1> is disabled to a logic 'low' level.

As shown in the drawing, before the active command BK<1> ACT is applied to the second bank BK<1> and the normal active operation is performed, the single bank refresh command BK<0> SBREF is applied to the first bank BK<0> and the refresh operation is performed. Thus, there is a concern that the internal addresses BAX12<0> and BAX12<1> are all enabled to a logic 'high' level in the early section of the normal active operation of the second bank BK<1>. In other words, the two word lines are to be simultaneously enabled in response to the internal addresses BAX12<0> and BAX12<1> in the first bank BK<0>, and just one word line is to be enabled in response to one address that is enabled between the Internal addresses BAX12<0> and BAX12<1> in the second bank BK<1>. However, in actuality, the two word lines are simultaneously enabled in the second bank BK<1>. When the two word lines are simultaneously enabled in the section where the active command BK<1> ACT is applied to the second bank BK<1>, a collision occurs between the data inputted and outputted during a normal active operation to/from the inside of the second bank BK<1>, and as a result, the normal active operation may not be performed.

The above-described concern does not arise when a general refresh operation where just one word line is refreshed is performed in the semiconductor memory device supporting the single bank refresh (SBREF) operation scheme, instead of the advanced refresh (AR) operation in which many word lines are enabled during one refresh operation.

In addition, the above-described concern does not arise when the single refresh operation is sequentially performed at the interval of the Ras to Ras delay tRRD, when the normal active operation is sequentially performed at the interval of the Ras to Ras delay tRRD, or when the single refresh operation is sequentially performed at the Interval of the Ras to Ras delay tRRD subsequent to the normal active operation in the two different banks, although the parallel-type advanced refresh (AR) operation is performed in the semiconductor memory device supporting the single bank refresh (SBREF) operation scheme.

The above-described concern does not arise when each of the two different banks receives a different address signal through an Independent address line in the semiconductor memory device supporting the single bank refresh (SBREF) operation scheme. However, considering there are a large number of banks included in the semiconductor memory device, it is not desirable to independently dispose the address line for each bank since the area occupied by the address line is increased.

As the semiconductor memory device operates faster and faster, the single bank refresh (SBREF) operation and the advanced refresh (AR) operation become more and more necessary. Therefore, the above-described concerns may be a significant issue affecting a normal operation of a semiconductor memory device.

SUMMARY

Exemplary embodiments of the present invention are directed to an address decoding circuit capable of performing a stable operation in a semiconductor memory device supporting a single bank refresh (SBREF) operation scheme and an advanced refresh (AR) operation scheme, and an address decoding method thereof.

In accordance with an embodiment of the present invention, a semiconductor memory device having a plurality of banks including a plurality of word lines and supporting an advanced refresh operation mode where two or more word lines are selected in parallel in each of the plurality of banks includes a pulse generation unit suitable for generating a single bank refresh pulse toggling during a predetermined time in response to a single bank refresh command corresponding to a single bank refresh operation mode where the plurality of banks perform a refresh operation or a normal operation at a predetermined interval, and an address generation unit suitable for generating an advanced single bank address for selecting at least two word lines in one bank among the plurality of banks in response to the single bank refresh pulse and an input address in an entry section of the advanced refresh operation mode.

In accordance with another embodiment of the present invention, a method for operating a semiconductor memory device which has a plurality of banks including a plurality of word lines and supports an advanced refresh operation mode where two or more word lines are selected in parallel in each of the plurality of banks and a single bank refresh operation mode where the plurality of banks perform a refresh operation or a normal operation at a predetermined interval includes: generating a single bank refresh pulse toggling during a predetermined time in response to a single bank refresh command corresponding to the single bank refresh operation mode; generating an advanced single bank address for selecting at least two word lines in one bank among the plurality of banks in response to the single bank refresh pulse and an input address in an entry section of the advanced refresh operation mode; and generating a normal active address for selecting one word line in one bank among the plurality of banks in response to an active command and the input address.

In accordance with a further embodiment of the present invention, a semiconductor memory device includes a pulse generation unit suitable for generating a single bank refresh pulse toggling during a set time in response to a single bank refresh command corresponding to a single bank refresh operation mode, an address generation unit suitable for generating advanced signal bank addresses based on an input address in response to the single bank refresh pulse and an advanced enable signal corresponding to an advanced refresh operation mode, and a plurality of banks each including a plurality of word lines and suitable for selecting two or more word lines in parallel in the advanced refresh operation mode, wherein one of the plurality of banks selects two or more word lines based on the advanced single bank addresses in parallel.

DETAILED DESCRIPTION

Hereafter, exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
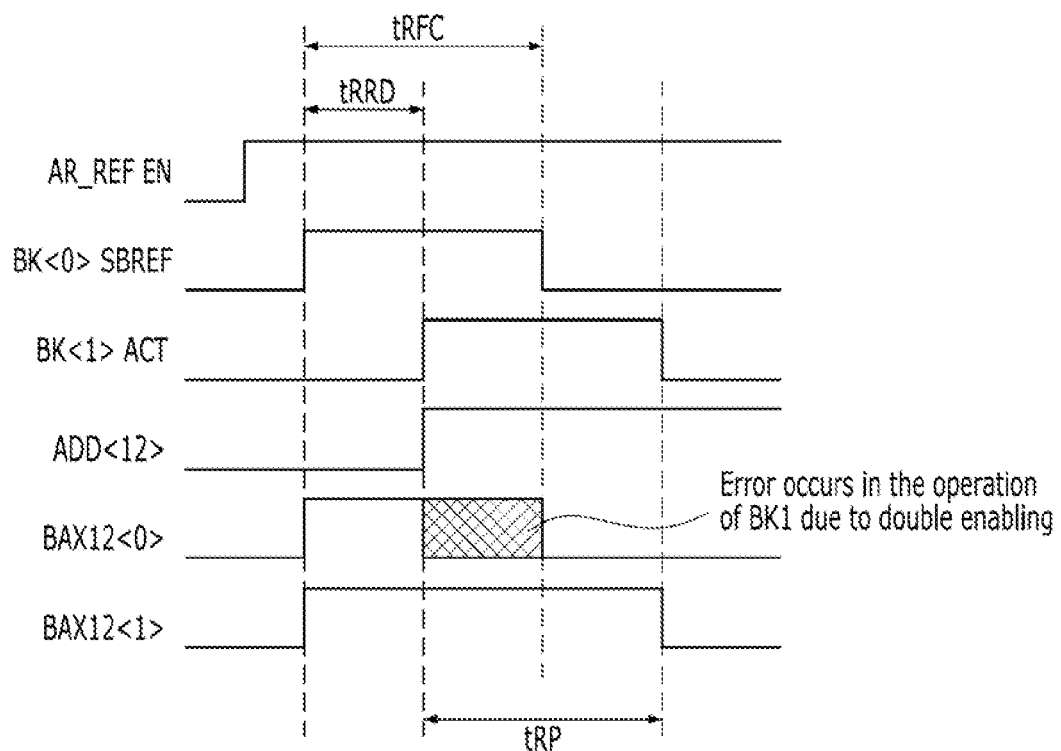
FIG. 1 is a timing diagram illustrating the concerns incurred when a parallel-type advanced refresh (AR) operation is performed in a semiconductor memory device supporting a single bank refresh (SBREF) operation scheme in accordance with prior art.
Figure 2:
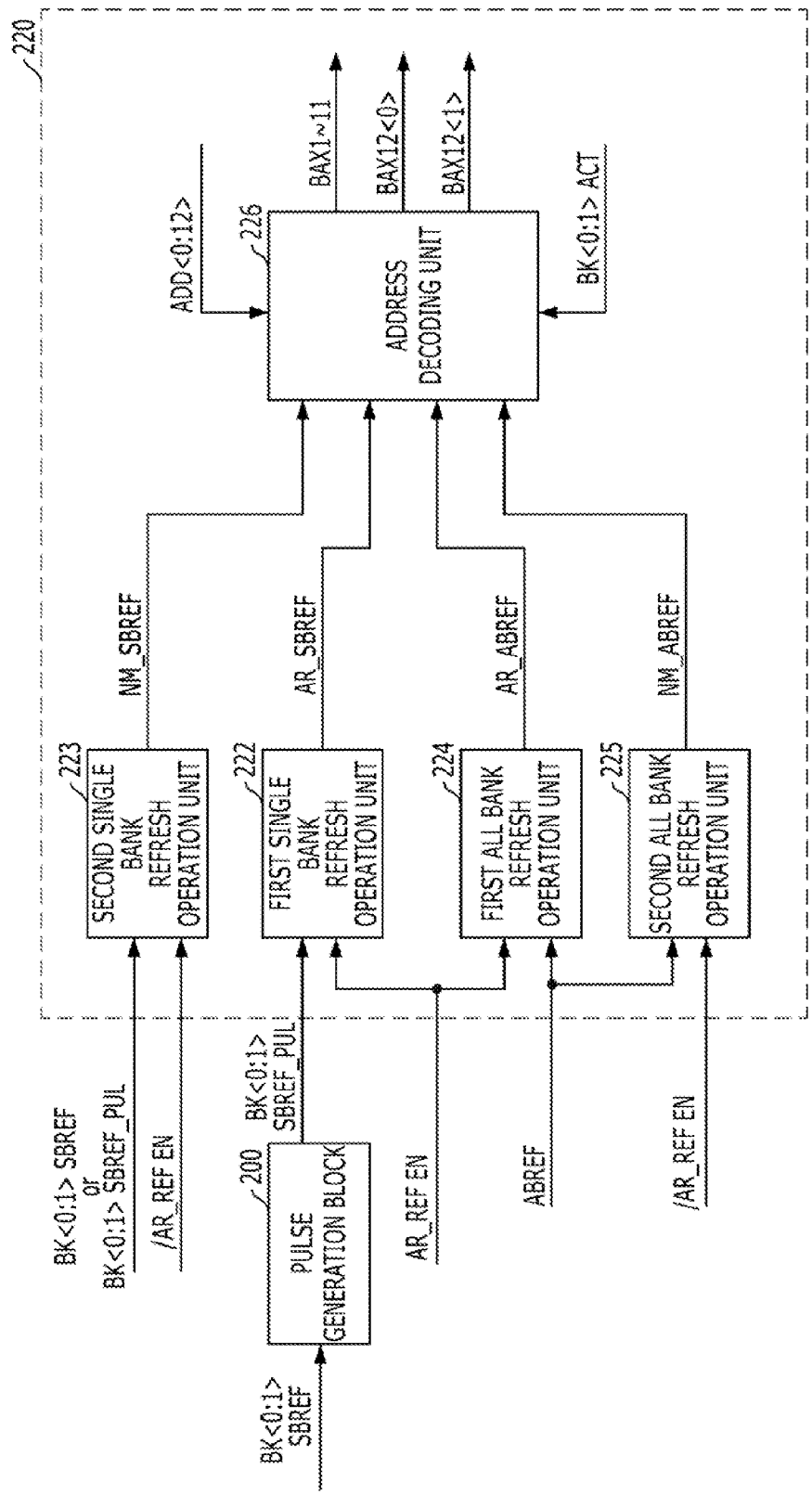
FIG. 2 is a block diagram illustrating a semiconductor memory device supporting a single bank refresh (SBREF) operation scheme and a parallel-type advanced refresh (AR) operation scheme in accordance with an embodiment of the present invention.

FIG. 2 is a block diagram illustrating a semiconductor memory device supporting a single bank refresh (SBREF) operation scheme and a parallel-type advanced refresh (AR) operation scheme in accordance with an embodiment of the present invention.

Referring to FIG. 2, the semiconductor memory device in accordance with the embodiment of the present invention includes a plurality of banks (not shown) including a plurality of word lines. The semiconductor memory device performs an advanced refresh operation mode wherein at least two or more word lines are selected in parallel in each of the multiple banks. The semiconductor memory device performs a single bank refresh operation mode in which each of the multiple banks independently selects and performs a refresh operation or a normal operation.

A detailed description on the advanced refresh operation mode and the single bank refresh operation mode is omitted since it was presented earlier when the prior art is described.

A semiconductor memory device in accordance with the embodiment of the present invention includes a pulse generation block 200 and an address generation block 220. The address generation block 220 includes a first single bank refresh operation unit 222, a second single bank refresh operation unit 233, a first all bank refresh operation unit 224, a second all bank refresh operation unit 225, and an address decoding unit 226.

The pulse generation block 200 generates a single bank refresh pulse BK<0:1> SBREF_PUL toggling during a predetermined time in response to single bank refresh commands BK<0:1> SBREF corresponding to the single bank refresh operation mode. The single bank refresh commands BK<0:1> SBREF include information for selecting one bank among the multiple banks. Since the multiple banks independently select and perform a refresh operation or a normal operation in the single bank refresh operation mode, the single bank refresh commands BK<0:1> SBREF are to include information for selecting one bank to perform a refresh operation. The semiconductor memory device shown in FIG. 2 includes two banks BK<0:1>. Therefore, whether or not a first bank BK<0> performs the refresh operation is decided based on whether or not a first single bank refresh command BK<0> SBREF among the single bank refresh commands BK<0:1> SBREF is enabled, and whether or not a second bank BK<1> performs the refresh operation is decided based on whether or not a second single bank refresh command BK<1> SBREF is enabled.

When one single bank refresh command among the single bank refresh commands BK<0:1> SBREF is enabled, the enabled single bank refresh command is kept in an enabling state during an active pre-charge time tRP corresponding to a minimum refresh cycle tRFC. For this reason, in the prior art, when active commands BK<0:1> ACT are applied subsequent to the single bank refresh commands BK<0:1> SBREF at an interval of a Ras to Ras delay tRRD, the section where the active commands BK<0:1> ACT are applied and the section where the single bank refresh commands BK<0:1> SBREF are kept in the enabling state overlap, causing the aforementioned concerns. Therefore, a predetermined time corresponding to the length of the toggling section of single bank refresh pulses BK<0:1> SBREF_PUL is shorter than a time corresponding to the interval of the Ras to Ras delay tRRD. In other words, the pulse generation block 200 enables the single bank refresh pulses BK<0:1> SBREF_PUL in response to the single bank refresh commands BK<0:1> SBREF and then disables the enabled single bank refresh pulses BK<0:1> SBREF_PUL before the time corresponding to the Ras to Ras delay tRRD passes.

The address generation block 220 generates advanced single bank addresses BAX1 to 11, BAX12<0> and BAX12<1> for selecting at least two word lines in one bank among the multiple banks BK<0:1> in response to the single bank refresh pulses BK<0:1> SBREF_PUL and input addresses ADD<0:12> in an entry section of the advanced refresh operation mode where an advanced enable signal AR_REF EN is enabled. For example, the address generation block 220 generates the advanced single bank addresses BAX1 to 11, BAX12<0> and BAX12<1> for selecting the two word lines in parallel in the first bank BK<0> when the first bank BK<0> among the multiple banks BK<0:1> is selected and the second bank BK<1> is not selected based on bank selection information loaded on the single bank refresh pulses BK<0:1> SBREF_PUL. Similarly, the address generation block 220 generates the advanced single bank addresses BAX1 to 11, BAX12<0> and BAX12<1> for selecting the two word lines in parallel in the second bank BK<1> when the second bank BK<1> among the multiple banks BK<0:1> is selected and the first bank BK<0> is not selected based on bank selection information loaded on the single bank refresh pulses BK<0:1> SBREF_PUL. Since whether or not the advanced single bank addresses BAX1 to 11, BAX12<0> and BAX12<1> are enabled is decided based on the enabling section of the single bank refresh pulses BK<0:1> SBREF_PUL, the length of the enabling section of the advanced single bank addresses BAX1 to 11, BAX12<0> and BAX12<1> becomes a predetermined time which is shorter than the Ras to Ras delay tRRD.

The address generation block 220 generates advanced all bank addresses BAX1 to 11, BAX12<0> and BAX12<1> for selecting at least two word lines in each of the multiple banks BK<0:1> in response to the all bank refresh command ABREF corresponding to the all bank refresh operation mode and the input addresses ADD<0:12> in the entry section of the advanced refresh operation mode where the advanced enable signal AR_REF EN is enabled. The all bank refresh operation mode whose technical concept is in opposite to that of the single bank refresh operation mode means a refresh operation method of a general semiconductor memory device. In other words, the refresh operation is performed by selecting not just one bank but all the multiple banks BK<0:1> in the all bank refresh operation mode simultaneously.

Since the length of the enabling section of the advanced all bank addresses BAX1 to 11, BAX12<0> and BAX12<1> is decided based on the enabling section of the all bank refresh command ABREF, the enabling section of the advanced all bank addresses BAX1 to 11, BAX12<0> and BAX12<1> is as long as the active pre-charge time tRP.

The address generation block 220 generates normal active addresses BAX1 to 11, BAX12<0> and BAX12<1> for selecting one word line in one bank among the multiple banks BK<0:1> in response to the input addresses ADD<0:12> and the active commands BK<0:1> ACT regardless of the entry of the advanced refresh operation mode. For example, the address generation block 220 generates the normal active addresses BAX1 to 11, BAX12<0> and BAX12<1> for selecting one word line in the first bank BK<0> when the first bank BK<0> is selected and the second bank BK<1> is not selected among the multiple banks BK<0:1> based on bank selection information loaded on the active commands BK<0:1> ACT. Similarly, the address generation block 220 generates the normal active addresses BAX1 to 11, BAX12<0> and BAX12<1> for selecting one word line in the second bank BK<1> when the second bank BK<1> is selected and the first bank BK<0> is not selected among the multiple banks BK<0:1> based on bank selection information loaded on the active commands BK<0:1> ACT. Since whether or not the normal active addresses BAX1 to 11, BAX12<0> and BAX12<1> are enabled is decided based on the enabling section of the active commands BK<0:1> ACT, the length of the enabling section of the normal active addresses BAX1 to 11, BAX12<0> and BAX12<1> is as long as the active pre-charge time tRP.

Also, the address generation block 220 generates normal single bank addresses BAX1 to 11, BAX12<0> and BAX12<1> for selecting one word line in one bank among the multiple banks BL<0:1> in response to the input addresses ADD<0:12> and the single bank refresh pulses BK<0:1> SBREF_PUL or the single bank refresh commands BK<0:1> SBREF in an exit section of the advanced refresh operation mode where the advanced enable signal AR_REF EN is disabled. For example, the address generation block 220 generates the normal single bank addresses BAX1 to 11, BAX12<0> and BAX12<1> for selecting one word line in the first bank BK<0> when the first bank BK<0> is selected among the multiple banks BK<0:1> and the second bank BK<1> is not selected based on bank selection information loaded on the single bank refresh pulses BK<0:1> SBREF_PUL or single bank refresh commands BK<0:1> SBREF. Similarly, the address generation block 220 generates the normal single bank addresses BAX1 to 11, BAX12<0> and BAX12<1> for selecting one word line in the second bank BK<1> when the second bank BK<1> is selected among the multiple banks BK<0:1> and the first bank BK<0> is not selected based on the bank selection information loaded on the single bank refresh pulses BK<0:1> SBREF_PUL or the single bank refresh commands BK<0:1> SBREF. Since whether or not the normal single bank addresses BAX1 to 11, BAX12<0> and BAX12<1> are enabled is decided based on the enabling section of the single bank refresh pulses BK<0:1> SBREF_PUL, the length of the enabling section of the normal single bank addresses BAX1 to 11, BAX12<0> and BAX12<1> becomes a predetermined time which is shorter than the Ras to Ras delay tRRD. When whether or not the normal single bank addresses BAX1 to 11, BAX12<0> and BAX12<1> are enabled is decided based on the enabling section of the single bank refresh commands BK<0:1> SBREF, the length of the enabling section of the normal single bank addresses BAX1 to 11, BAX12<0> and BAX12<1> is as long as the active pre-charge time tRP.

The address generation block 220 also generates normal all bank addresses BAX1 to 11, BAX12<0> and BAX12<1> for selecting one word line in each of the multiple banks BK<0:1> in response to an all bank refresh command ABREF and the input addresses ADD<0:12> in the exit section of the advanced refresh operation mode where the advanced enable signal AR_REF EN is disabled. Since whether or not the normal all bank addresses BAX1 to 11, BAX12<0> and BAX12<1> are enabled is decided based on the enabling section of the all bank refresh command ABREF, the length of the enabling section of the normal all bank addresses BAX1 to 11, BAX12<0> and BAX12<1> is as long as the active pre-charge time tRP.

The first single bank refresh operation unit 222 included in the address generation block 220 generates an advanced single bank refresh operation signal AR_SBREF in response to the single bank refresh pulses BK<0:1> SBREF_PUL in the enabling section of the advanced enable signal AR_REF EN.

The first all bank refresh operation unit 224 included in the address generation block 220 generates an advanced all bank refresh operation signal AR_ABREF in response to the all bank refresh command ABREF in the enabling section of the advanced enable signal AR_REF EN.

The second single bank refresh operation unit 233 included in the address generation block 220 generates a normal single bank refresh operation signal NM_SBREF in response to the single bank refresh pulses BK<0:1> SBREF_PUL or the single bank refresh commands BK<0:1> SBREF in a disabling section of the advanced enable signal AR_REF EN.

The second all bank refresh operation unit 225 included in the address generation block 220 generates a normal all bank refresh operation signal NM_ABREF in response to the all bank refresh command ABREF in the disabling section of the advanced enable signal AR_REF EN.

The address decoding unit 226 included in the address generation block 220 generates the advanced single bank addresses BAX1 to 11, BAX12<0> and BAX12<1> in response to the advanced single bank refresh operation signal AR_SBREF and the input addresses ADD<0:12>. The address decoding unit 226 generates the advanced all bank addresses BAX1 to 11, BAX12<0> and BAX12<1> in response to the advanced all bank refresh operation signal AR_ABREF and the input addresses ADD<0:12>. The address decoding unit 226 generates the normal single bank addresses BAX1 to 11, BAX12<0> and BAX12<1> in response to the normal single bank refresh operation signal NM_SBREF and the input addresses ADD<0:12>. The address decoding unit 226 also generates the normal active addresses BAX1 to 11, BAX12<0> and BAX12<1> in response to the active commands BK<0:1> ACT and the input addresses ADD<0:12>. The address decoding unit 226 generates the normal all bank addresses BAX1 to 11, BAX12<0> and BAX12<1> in response to the normal all bank refresh operation signal NM_ABREF and the input addresses ADD<0:12>.

The difference between the addresses generated from the address generation block 220 is that their names and internal values are fixed to particular names and values depending on the operation modes, but they have basically the same forms. For example, the advanced single bank addresses BAX1 to 11, BAX12<0> and BAX12<1>, the advanced all bank addresses BAX1 to 11, BAX12<0> and BAX12<1>, the normal single bank refresh addresses BAX1 to 11, BAX12<0> and BAX12<1>, the normal all bank addresses BAX1 to 11, BAX12<0> and BAX12<1> and the normal active addresses BAX1 to 11, BAX12<0> and BAX12<1> have the same reference numerals since their names and internal values are fixed to particular names and values depending on the operation modes.

The addresses BAX1 to 11, BAX12<0> and BAX12<1> whose name has a term "advanced" are formed to include two bits BAX12<0> and BAX12<1> of the same logic level. In other words, the two bits BAX12<0> and BAX12<1> are all fixed at a logic 'high' level or a logic 'low' level based on a value of a bit ADD<12> of the input addresses ADD<0:12> that indicates two word lines are simultaneously selected in parallel inside a bank based on the addresses BAX1 to 11, BAX12<0> and BAX12<1> whose name has the term "advanced".

The addresses BAX1 to 11, BAX12<0> and BAX12<1> whose name has a term "normal" are formed to include two bits BAX12<0> and BAX12<1> of the different logic levels. In other words, one of the two bits BAX12<0> and BAX12<1> has a value of the logic 'high' level and the other of the two bit BAX12<0> and BAX12<1> has a value of the logic 'low' level based on the value of the bit ADD<12> of the input addresses ADD<0:12> that indicates one word line is selected inside a bank based on the addresses BAX1 to 11, BAX12<0> and BAX12<1> whose name has the term "normal".

The addresses BAX1 to 11, BAX12<0> and BAX12<1> whose name has a term "single bank" include information for selecting one of the multiple banks. On the contrary, the addresses BAX1 to 11, BAX12<0> and BAX12<1> whose name has a term "all bank" include information for simultaneously selecting all of the multiple banks.

One feature of the present invention is that the length of the enabling section of the advanced single bank addresses BAX1 to 11, BAX12<0> and BAX12<1> is shorter than the Ras to Ras delay tRRD.

Since the length of the enabling section of the advanced single bank addresses BAX1 to 11, BAX12<0> and BAX12<1> is shorter than the Ras to Ras delay tRRD, no concern occurs although the normal active addresses BAX1 to 11, BAX12<0> and BAX12<1> are generated at the interval of the Ras to Ras delay tRRD subsequent to the advanced single bank addresses BAX1 to 11, BAX12<0> and BAX12<1>. That is, the generation section of the advanced single bank addresses BAX1 to 11, BAX12<0> and BAX12<1> where the two bits BAX12<0> and BAX12<1> are fixed at the same logic level may not overlap with the generation section of the normal active addresses where the two bits BAX12<0> and BAX12<1> have the different logic levels.

The enabling section of the addresses other than the advanced single bank addresses BAX1 to 11, BAX12<0> and BAX12<1> have a length corresponding to the active precharge time tRP. It does not matter whether the enabling section of the normal single bank addresses BAX1 to 11, BAX12<0> and BAX12<1> has a length shorter than the active pre-charge time tRP, or corresponding to the active pre-charge time tRP. The enabling section of the other addresses including the advanced single bank addresses BAX1 to 11, BAX12<0> and BAX12<1> may have a shorter length than the Ras to Ras delay tRRD depending on the decision of a system designer.

Figure 3:
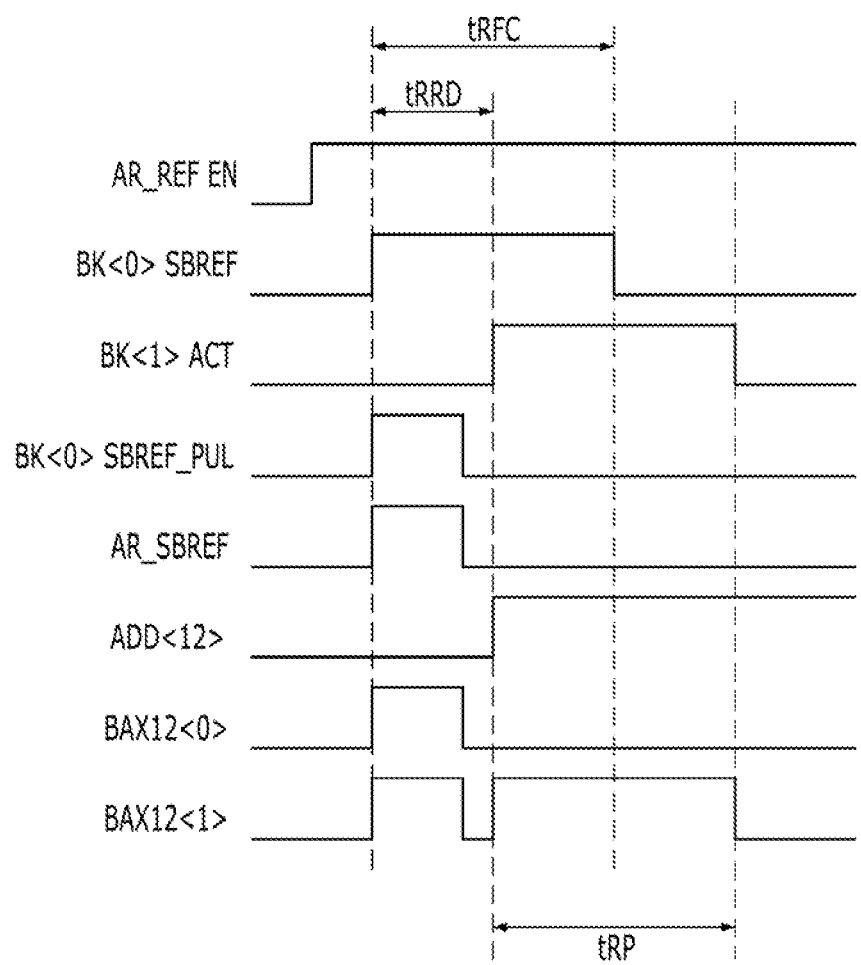
FIG. 3 is a timing diagram illustrating a method for operating the semiconductor memory device shown in FIG. 2 in accordance with an embodiment of the present invention.

FIG. 3 is a timing diagram illustrating a method for operating the semiconductor memory device shown in FIG. 2, which supports a single bank refresh (SBREF) operation scheme and a parallel-type advanced refresh (AR) operation scheme.

Referring to FIG. 3, the parallel-type advanced refresh (AR) operation scheme may be performed in the semiconductor memory device supporting the single bank refresh (SBREF) operation scheme without a collision between internal addresses BAX1 to 11, BAX12<0> and BAX12<1> generated in an address generation block 220, even when a single bank refresh command BK<0> SBREF is applied to a first bank BK<0> to perform a refresh operation and an active command BK<1> ACT is applied to a second bank BK<1> at an interval of Ras to Ras delay tRRD to perform a normal active operation.

To be specific, the single bank refresh command BK<0> SBREF is applied to the first bank BK<0> in an entry section of an advanced refresh operation mode where an advanced enable signal AR_REF EN is enabled in order to perform the refresh operation. It may be seen that the refresh operation corresponding to the single bank refresh command BK<0> SBREF is maintained during an interval of a refresh cycle tRFC.

When the single bank refresh command BK<0> SBREF is applied to the first bank BK<0>, a single bank refresh pulse BK<0> SBREF_PUL on the first bank BK<0> toggles during a predetermined time. Herein, the enabling time of the single bank refresh pulse BK<0> SBREF_PUL where the single bank refresh pulse BK<0> SBREF_PUL is enabled while toggling is shorter than the Ras to Ras delay tRRD. In other words, the single bank refresh pulse BK<0> SBREF_PUL toggles within a section after the single bank refresh command BK<0> SBREF is applied to the first bank BK<0> and before the active command BK<1> ACT is applied to the second bank BK<1>.

While the single bank refresh pulse BK<0> SBREF_PUL on the first bank BK<0> shortly toggles, the internal addresses BAX12<0> and BAX12<1> are all enabled in a short section in response to the disabling of an input address ADD<12>.

One of characteristics of an address decoding method for performing an advanced refresh operation is that the internal addresses BAX12<0> and BAX12<1> have two values although the input address ADD<12> has one value. In other words, when the refresh operation is performed in an enabling section of the advanced enable signal AR_REF EN, the two values of the internal addresses BAX12<0> and BAX12<1> are simultaneously controlled in response to the input address ADD<12> in order to simultaneously enable two word lines in one bank. For example, when the input address ADD<12> is enabled to a logic 'high' level in the enabling section of the advanced enable signal AR_REF EN, the internal addresses BAX12<0> and BAX12<1> are disabled to a logic 'low' level. When the input address ADD<12> is disabled to a logic 'low' level, the internal addresses BAX12<0> and BAX12<1> are enabled to a logic 'high' level. For a simple description, just one input address ADD<12> among the input addresses ADD<0:12> is illustrated in the drawing. During actual operation of the semiconductor memory device, the multiple word lines included in one bank are selected in pairs for each of the input addresses ADD<0:12>.

As shown in the drawing, when the single bank refresh pulse BK<0> SBREF_PUL on the first bank BK<0> toggles, the two internal addresses BAX12<0> and BAX12<1> are simultaneously enabled, and the two word lines included in the first bank BK<0> are simultaneously enabled and refreshed. The enabled internal addresses BAX12<0> and BAX12<1> are kept in the enabling state for a time shorter than the Ras to Ras delay tRRD where the single bank refresh pulse BK<0> SBREF_PUL toggles.

When time passes as long as the Ras to Ras delay tRRD after the single bank refresh commands BK<0:1> SBREF are applied to the first bank BK<0> and the refresh operation begins, the active command BK<1> ACT is applied to the second bank BK<1> and the normal active operation is performed. The active command BK<1> ACT is maintained during an active pre-charge time tRP. The section where the refresh operation is performed in the first bank BK<0> overlaps with the section where the normal active operation is performed in the second bank BK<1>. The overlapping operation sections do not affect each other because the operations are performed in different banks.

One word line is to be enabled in the second bank BK<1> since the advanced refresh operation is not applied to the normal active operation on the second banks BK<1>. In short, whether or not the two internal addresses BAX12<0> and BAX12<1> are enabled is decided in response to whether or not the input address ADD<12> is enabled. For example, when the input address ADD<12> is enabled to a logic 'high' level while the active command BK<1> ACT is enabled, the first internal address BAX12<0> between the internal addresses BAX12<0> and BAX12<1> is disabled to a logic 'low' level and the second internal address BAX12<1> between the internal addresses BAX12<0> and BAX12<1> is enabled to a logic 'high' level. When the input address ADD<12> is disabled to a logic 'low' level while the active command BK<1> ACT is enabled, the first internal address BAX12<0> between the internal addresses BAX12<0> and BAX12<1> is enabled to a logic 'high' level and the second internal address BAX12<1> between the internal addresses BAX12<0> and BAX12<1> is disabled to a logic 'low' level.

Therefore, as shown in the drawing, the first internal address BAX12<0> between the internal addresses BAX12<0> and BAX12<1> is disabled and the second internal address BAX12<1> is enabled in response to the enabling of the input address ADD<12> when the active command BK<1> ACT is applied to the second bank BK<1>.

The operation where the internal addresses BAX12<0> and BAX12<1> have the same logic level due to the single refresh operation on the first bank BK<0> is completed before the normal active operation on the second bank BK<1> is performed due to the short toggling of the single bank refresh pulse BK<0> SBREF_PUL. Therefore, the normal active operation on the second bank BK<1> may be normally performed without any obstacles.

In accordance with the embodiments of the present invention as described above, when the normal active operation subsequent to the single bank refresh operation is sequentially performed in the semiconductor memory device supporting the single bank refresh and the advanced refresh, the operations may be performed stably without affecting each other by decoding the input address into the pulse structure.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

For example, just two banks are included in the semiconductor memory device in accordance with the embodiments of the present invention for the simple description. However, in reality more than two banks may be included in the semiconductor memory device.

What is claimed is:

1. A semiconductor memory device having a plurality of banks including a plurality of word lines and supporting an advanced refresh operation mode where two or more word lines are selected in parallel in each of the plurality of banks, comprising:
   a pulse generation unit suitable for generating a single bank refresh pulse toggling during a predetermined time in response to a single bank refresh command corresponding to a single bank refresh operation mode where each of the plurality of banks independently selects and performs a refresh operation or a normal operation at a predetermined interval; and
   an address generation unit suitable for generating an advanced single bank address for selecting at least two word lines in one bank among the plurality of banks in response to the single bank refresh pulse and an input address in an entry section of the advanced refresh operation mode,
   wherein the address generation unit generates an advanced all bank address for selecting at least two word lines in each of the plurality of banks in response to the input address and an all bank refresh command corresponding to an all bank refresh operation mode where the plurality of banks are all selected and refreshed simultaneously in the entry section of the advanced refresh operation mode,
   wherein the address generation unit includes:
   a first single bank refresh operation unit suitable for generating an advanced single refresh operation signal in response to the single bank refresh pulse in an enabling section of an advanced enable signal deciding whether to enter the advanced refresh operation mode or not;
   a first all bank refresh operation unit suitable for generating an advanced all bank refresh operation signal in response to the all bank refresh command in the enabling section of the advanced enable signal; and
   an address decoding unit suitable for generating the advanced single bank address in response to the advanced single refresh operation signal and the input address and generating the advanced all bank address in response to the advanced all bank refresh operation signal and the input address.

2. The semiconductor memory device of claim 1, wherein the address generation unit generates a normal single bank address for selecting one word line in one bank among the plurality of banks in response to the input address and the single bank refresh pulse or the single bank refresh command in an exit section of the advanced refresh operation mode.

3. The semiconductor memory device of claim 2, wherein the address generation unit generates a normal active address for selecting one word line in one bank among the plurality of banks in response to the input address and an active command, regardless of the advanced refresh operation mode.

4. The semiconductor memory device of claim 3, wherein the address generation unit generates a normal all bank address for selecting one word line in each of the plurality of banks in response to the all bank refresh command and the input address in the exit section of the advanced refresh operation mode.

5. The semiconductor memory device of claim 4, wherein the address generation unit further includes:
   a second single bank refresh operation unit suitable for generating a normal single bank refresh operation signal in response to the single bank refresh pulse or the single bank refresh command in a disabling section of the advanced enable signal; and a second all bank refresh operation unit suitable for generating a normal all bank refresh operation signal in response to the all bank refresh command in the disabling section of the advanced enable signal,
wherein the address decoding unit generates the normal single bank address in response to the normal single bank refresh operation signal and the input address, the normal active address in response to the active command and the input address, and the normal all bank address in response to the normal all bank refresh operation signal and the input address.

6. The semiconductor memory device of claim 1, wherein the predetermined time is shorter than a Ras to Ras delay which is ensured between two commands that are inputted sequentially.

7. The semiconductor memory device of claim 1, wherein the predetermined time is shorter than the predetermined interval.

8. A method for operating a semiconductor memory device which has a plurality of banks including a plurality of word lines and supports an advanced refresh operation mode where two or more word lines are selected in parallel in each of the plurality of banks and a single bank refresh operation mode where each of the plurality of banks independently selects and performs a refresh operation or a normal operation at a predetermined interval, comprising:
generating a single bank refresh pulse toggling during a predetermined time in response to a single bank refresh command corresponding to the single bank refresh operation mode;
generating an advanced single bank address for selecting at least two word lines in one bank among the plurality of banks in response to the single bank refresh pulse and an input address in an entry section of the advanced refresh operation mode; and
generating a normal active address for selecting one word line in one bank among the plurality of banks in response to an active command and the input address,
wherein the generating of an advanced single bank address includes:
generating an advanced all bank address for selecting at least two word lines in each of the plurality of banks in response to the input address and an all bank refresh command corresponding to an all bank refresh operation mode where the plurality of banks are all selected and refreshed simultaneously in the entry section of the advanced refresh operation mode
generating an advanced single refresh operation signal in response to the single bank refresh pulse in an enabling section of an advanced enable signal deciding whether to enter the advanced refresh operation mode or not;
generating an advanced all bank refresh operation signal in response to all bank refresh command where the plurality of banks are all selected and refreshed simultaneously in the entry section of the advanced refresh operation mode in the enabling section of the advanced enable signal; and
generating the advanced single bank address in response to the advanced single refresh operation signal and the input address and generating the advanced all bank address in response to the advanced all bank refresh operation signal and the input address.

9. The method of claim 8, wherein the single bank refresh command and the active command are sequentially inputted at an interval of a Ras to Ras delay which is ensured between two commands that are inputted sequentially.

10. The method of claim 9, wherein the predetermined time is shorter than the Ras to Ras delay.

11. The semiconductor memory device of claim 8, wherein the predetermined time is shorter than the predetermined interval.

12. The method of claim 8, further comprising:
generating a normal single bank address for selecting one word line in one bank among the plurality of banks in response to the input address and the single bank refresh pulse or the single bank refresh command in an exit section of the advanced refresh operation mode.

13. The method of claim 8, further comprising:
generating a normal all bank address for selecting one word line in each of the plurality of banks in response to the all bank refresh command and the input address in an exit section of the advanced refresh operation mode.

14. A semiconductor memory device, comprising:
a pulse generation unit suitable for generating a single bank refresh pulse toggling during a set time in response to a single bank refresh command corresponding to a single bank refresh operation mode;
an address generation unit suitable for generating advanced signal bank addresses based on an input address in response to the single bank refresh pulse and an advanced enable signal corresponding to an advanced refresh operation mode; and
a plurality of banks each including a plurality of word lines and suitable for selecting two or more word lines in parallel in the advanced refresh operation mode, wherein one of the plurality of banks selects two or more word lines based on the advanced single bank addresses in parallel,
wherein the generating of an advanced single bank address includes:
generating an advanced all bank address for selecting at least two word lines in each of the plurality of banks in response to the input address and an all bank refresh command corresponding to an all bank refresh operation mode where the plurality of banks are all selected and refreshed simultaneously in the entry section of the advanced refresh operation mode
generating an advanced single refresh operation signal in response to the single bank refresh pulse in an enabling section of an advanced enable signal deciding whether to enter the advanced refresh operation mode or not;
generating an advanced all bank refresh operation signal in response to all bank refresh command where the plurality of banks are all selected and refreshed simultaneously in the entry section of the advanced refresh operation mode in the enabling section of the advanced enable signal; and
generating the advanced single bank address in response to the advanced single refresh operation signal and the input address and generating the advanced all bank address in response to the advanced all bank refresh operation signal and the input address.

15. The semiconductor memory device of claim 14, wherein the plurality of banks perform a refresh operation or a normal operation at a set interval in the single bank refresh operation mode, wherein the set time is shorter than the set interval.

* * * * *